(12) United States Patent
Morini

(10) Patent No.: US 7,557,644 B2
(45) Date of Patent: Jul. 7, 2009

(54) FULLY INTEGRATED FLOATING POWER SUPPLY FOR HIGH VOLTAGE TECHNOLOGIES INCLUDING N-EPI BIASING

(75) Inventor: Sergio Morini, Pavia (IT)

(73) Assignee: International Rectifier Corporation, El Segundo, CA (US)

( * ) Notice: Subject to any disclaimer, the term of this patent is extended or adjusted under 35 U.S.C. 154(b) by 336 days.

(21) Appl. No.: 11/538,457

(22) Filed: Oct. 4, 2006

(65) Prior Publication Data

US 2007/0096256 A1    May 3, 2007

Related U.S. Application Data

(60) Provisional application No. 60/794,020, filed on Apr. 21, 2006, provisional application No. 60/724,373, filed on Oct. 7, 2005.

(51) Int. Cl.
*H01L 25/00* (2006.01)
*H02M 1/00* (2007.01)

(52) U.S. Cl. .................................. 327/564; 363/147
(58) Field of Classification Search .............. 363/147; 327/565, 566, 541, 564
See application file for complete search history.

(56) References Cited

U.S. PATENT DOCUMENTS 5,502,412 A * 3/1996 Choi et al. ............... 327/333
6,828,753 B2  12/2004 Grasso et al.

2003/0231046 A1  12/2003  Giacomini et al. .......... 327/333
2004/0056627 A1   3/2004  Grasso et al. .............. 318/609

FOREIGN PATENT DOCUMENTS

WO       WO 03/017463 A1     2/2003

OTHER PUBLICATIONS

European Search Report dated Oct. 9, 2007.
B. Murari, F. Bertotti, G. S. Vignola, "Smart power ICs" chapter 2, Sprinter-Verlag, Berlino 1996.
A. W. Ludikhuize, "A Review of RESURF Technology", Power Semiconductor Devices and ICs, 2000, The 12th International Symposium on May 22-25, 2000, pp. 11-18.
J. S. Ajit, D. Kinzer, N. Ranjan, "1200V High-Side Lateral MOSFET in Junction-Isolated Power IC Technology Using Two Field Reduction Layers" Power Semiconductor Devices and ICs, 1993. ISPSD "93. Proceedings of the 5th International Symposium on May 18-20, 1993 pp. 230-235.
A. Merello, A. Rugginenti, M. Grasso, "Using monolithic high voltage Gate-Drivers."
A. Lidow, D. Kinzer G. Sheridan, D. Tam, "The semiconductor roadmap for power management in the new millennium", Proceeding of the IEEE, vol. 89, Issue 6, Jun. 2001 pp. 803-812.

* cited by examiner

*Primary Examiner*—Shawn Riley
(74) *Attorney, Agent, or Firm*—Farjami & Farjami LLP

(57) ABSTRACT

An integrated circuit for feeding data acquisition circuits is provided. The integrated circuit including an inverter application having a half-bridge driver for driving high and low side switches connected in a half bridge, a data acquisition circuit formed in monolithic high voltage technology, and a Low Voltage Floating Supply (LVFS) circuit for providing voltage to the data acquisition circuit, the LVFS circuit being formed in a floating n-epi pocket biased with a voltage that is lower than a maximum value of a voltage present in the n-epi pocket.

19 Claims, 5 Drawing Sheets

FULLY INTEGRATED FLOATING POWER SUPPLY FOR HIGH VOLTAGE TECHNOLOGIES INCLUDING N-EPI BIASING

CROSS-REFERENCE TO RELATED APPLICATION

This application is based on and claims the benefit of U.S. Provisional Application Ser. No. 60/724,373, filed on Oct. 7, 2005, entitled INTEGRATED FLOATING POWER SUPPLY FOR CURRENT SENSOR CHIP IN MONOLITHIC HIGH VOLTAGE TECHNOLOGY and U.S. Provisional Application Ser. No. 60/794,020, filed on Apr. 21, 2006 entitled INTEGRATED FLOATING POWER SUPPLY FOR CURRENT SENSOR CHIP IN MONOLITHIC HIGH VOLTAGE TECHNOLOGY, to which a claim of priority is hereby made and the disclosures of which are incorporated by reference.

BACKGROUND OF THE INVENTION

The present invention is directed to voltage supplies for feeding data acquisition circuits and more particularly to fully integrated Low Voltage Floating Supply in a current sensor chip realized in monolithic high voltage technology.

FIG. 1 illustrates a circuit 10 of a single inverter leg of a common inverter application used for a motor-drive control. The circuit 10 includes a half-bridge driver 12 for driving a high side switch 14 and a low side switch 16. In such application a phase current is often sensed using a shunt resistor connected between the X node and the load. The voltage data provided by the shunt is detected by a current sensor chip 18 realized in monolithic high voltage integrated technology. Current sensing circuits, discussed in B. Murari, F. Bertotti, G. S. Vignola, "Smart power ICs" chapter 2, Sprinter-Verlag, Berlino 1996, which is incorporated herein by reference, are included in a floating n-epi pocket referred to the X node, allowing data to be detected by rejecting the common mode present at this node ($V_X$=0V÷600V).

Typically a bootstrap capacitor $C_B$ is used to supply the floating side of the chip. The bootstrap capacitor $C_B$ is charged by a 15V source when the low side switch 16 is closed and provides $V_F$=15V referred to $V_X$ when the high side switch 14 is closed in compliance with power transistor drive requirements. This external voltage supply $V_F$ is characterized by a ripple noise due to the charging and discharging phases on the bootstrap capacitor $C_B$.

In general, high voltage technologies can benefit from the continuous size reduction of the MOSFETs used in signal processing circuits. In contrast, smaller devices usually require a lower than 15V supply voltage. Hence, in order to exploit the size reducing technologies, a floating supply must be realized that is capable of deriving a stable 5V supply from the $V_F$ voltage.

SUMMARY OF THE INVENTION

Therefor, it is an object of the present invention to provide a solution that allows a fully integrated Low Voltage Floating Supply (LVFS) to be realized with an output voltage $V_{out} \leq 5V$.

It is another object of the present invention to realize the fully integrated LVFS for feeding data acquisition circuits in a current sensor chip realized in monolithic high voltage technology.

It is yet another object of the present invention to realize the fully integrated LVFS in a floating n-epi pocket biased with a voltage lower than the maximum voltage value present in the pocket itself.

It is stil another object of the present invention to use an advanced MOSFET family for signal processing so as to keep a floating epi well biased with a voltage lower than the maximum voltage value present in it.

An integrated circuit for feeding data acquisition circuits is provided. The integrated circuit including an inverter application having a half-bridge driver for driving high and low side switches connected in a half bridge, a data acquisition circuit formed in monolithic high voltage technology, and a Low Voltage Floating Supply (LVFS) circuit for providing voltage to the data acquisition circuit, the LVFS circuit being formed in a floating n-epi pocket biased with a voltage that is lower than a maximum value of a voltage present in the n-epi pocket.

Other features and advantages of the present invention will become apparent from the following description of the invention that refers to the accompanying drawings.

DETAILED DESCRIPTION OF EMBODIMENTS OF THE INVENTION

Figure 1:
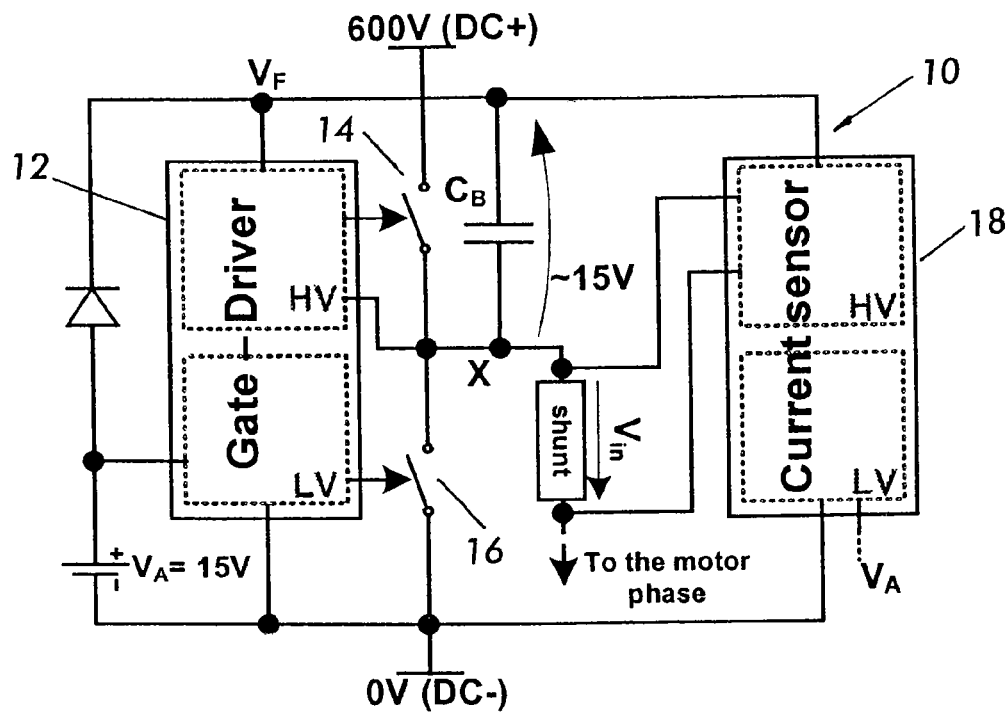
FIG. 1 is a circuit diagram of a single inverter leg of common inverter applications used for motor-drive control.
Figure 2:
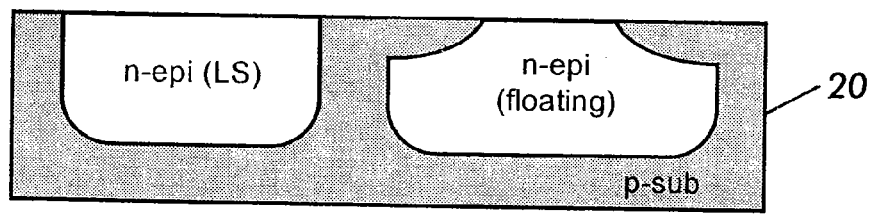
FIG. 2 is a diagram of a cross-section of a single p-type substrate having two different epitaxialy grown n-epi pockets.

To understand working conditions of a current sensor chip of the present invention, it is useful to provide a general description of the system being examined and the characteristics of a technology adopted. This adopted technology allows both sensing circuitry and logic interface to be integrated on the same chip. FIG. 2 illustrates a cross-section of a single P-type substrate 20 having two different epitaxialy grown n-epi pockets. All the circuits, the sensing circuitry and logic interface, are realized in epi pockets, the epi pockets are made in the P-type substrate 20 that is connected to the global ground DC− (FIG. 1) of the system.

The floating pocket, which is referred to the X node, is characterized by a particular geometric shape that allows the n-epi/p-sub junction to withstand a high reverse-bias voltage. Resurf® technique discussed in U.S. Pat. No. 6,828,753, entitled "Input Filter for AC Motor Phase Current sensing" issued to M. Grasso, S. Morini, A. Rugginenti on Dec. 7, 2004; A. W. Ludikhuize, "A Review of RESURF Technology", Power Semiconductor Devices and ICs, 2000. The 12th International Symposium on 22-25 May 2000, Page(s) 11-18; J. S. Ajit, D. Kinzer, N. Ranjan, "1200V High-Side Lateral MOSFET in Junction-Isolated Power IC Technology Using Two Field Reduction Layers", Power Semiconductor Devices and ICs, 1993. ISPSD '93. Proceedings of the 5th International Symposium on 18-20 May 1993 Pages 230-235; A. Merello, A. Rugginenti, M. Grasso, "Using monolithic high voltage Gate-Drivers"; and A. Lidow, D. Kinzer G. Sheridan, D. Tam, "The semiconductor roadmap for power management in the new millennium", Proceeding of the IEEE, vol. 89, Issue 6, June 2001 Page(s): 803-812, which are incorporated herein by reference, is generally employed to properly shape the electrical field. Therefore, the junction breakdown can be tuned to reach as much as 1200V. The low side epi pocket LS is biased by a fixed voltage (15V) and referred to DC−. The exchange of information between the two pockets is implemented by DMOS devices using short current pulses. All the voltage values disclosed below are referred to the instantaneous value of the common-mode $V_X$ (DC+ or DC−).

Currently, MOS technologies with 2 μm and 0.5 μm channel-length, called a 20V technology and a 5V technology respectively are available. Also, at present $V_F$ is the only voltage available to bias the floating epi pocket and to supply the current sensing circuits. Therefore, the epi pocket and the current sensing circuits are realized with MOS in 20V technology.

As stated above, the object of the present invention is to develop the sensing circuits within the 5V technology MOS family that guarantees better performance and less power consumption than the first MOS family. Moreover, the total area occupied by the supply and sensing circuits in the 5V technology is smaller than the area required only for sensing circuits in the 20V technology. This latter advantage acquires importance as the complexity of the signal processing part increases. Moreover, 5V technology devices help to realize circuits whose performance is not available through the use of the 20V technology.

In an n-epi pocket the n-channel MOS are realized in a p-well, while the p-channel MOS are formed directly into the epitaxial layer. This means that n-epi pocket constitutes the body for p-channel devices. Using the external supply $V_F$ to bias the epi pocket, the body of the p-channel is biased at 15V: using 5V devices, the working range should be comprised between 15V ($V_F$) and 10V ($V_F$−5V). As a consequence, the sensing circuitry and the shunt resistor voltage $V_{in}$ require two different reference voltages, i.e., $V_X$+10V for the sensing circuitry and $V_X$ for the shunt resistor, and a voltage shift becomes necessary. Voltage shifting operations can worsen the signal to noise ratio of the signal that must be processed. Hence it is necessary to realize a power supply that provides an output voltage of 5V or 3.3V referred to $V_X$ while at the same time biasing the floating pocket.

Advantages and disadvantages of the proposed solution with regard to the supply circuits are discussed below. A comparison between theoretical and experimental results that showed some unpredicted behavior by the circuit, its analysis and explanation is also discussed.

Realizing the LVFS

The Low Voltage Floating Supply (LVFS) can be implemented in a number of different ways. Advantages and disadvantages of these varied solutions are highlighted below to elucidate the reasons behind the choice that was made. The first solution in obtaining the 5V-technology voltage supply is to perform regulation without integrating it in the current sensor chip. This solution can be implemented with an external LVFS chip, referred to X node. A regulator realizes a voltage $V_{out}$ starting from $V_F$ (see FIG. 1). In this manner there are no topology limits for the LVFS circuit. The disadvantages of this solution are the presence of an additional chip in the system and the effect of the coupling noise on the board.

The second solution in obtaining the 5V-technology voltage supply may be to realize the current sensor chip with a second floating n-epi pocket that contains the LVFS. It is possible to use $V_F$ to bias this epi pocket so that there are no restrictions on the supply's topology. However, some problems arise while providing the voltage $V_{out}$ to the other floating epi pocket that contains current sensing circuits when $V_X$=600V.

Figure 3:
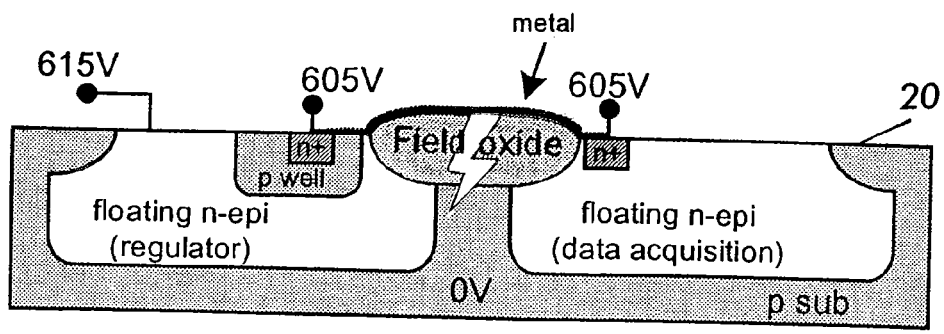
FIG. 3 is a diagram of a cross-section of a single p-type substrate having two different epitaxialy grown n-epi pockets in which field oxide is crossed with a metal to provide LVFS.

FIG. 3 illustrates an implementation of the second solution of providing LVFS by crossing field oxide with a metal. Here, the second solution is realized by using a metal, which crosses the field oxide zone between the epi pockets. Since the substrate 20 is connected to the system ground DC−, some oxide breakdown problems occur when $V_F$=615V. This solution has a number of disadvantages. To guarantee the integrity of the IC, it is necessary to realize a thicker than usual field oxide, thereby prolonging the field oxide deposition step. Moreover, any modification to a process step requires very expensive and time consuming reliability and quality tests. Hence, this solution can be considered viable only for high volume production of the device.

Figure 4:
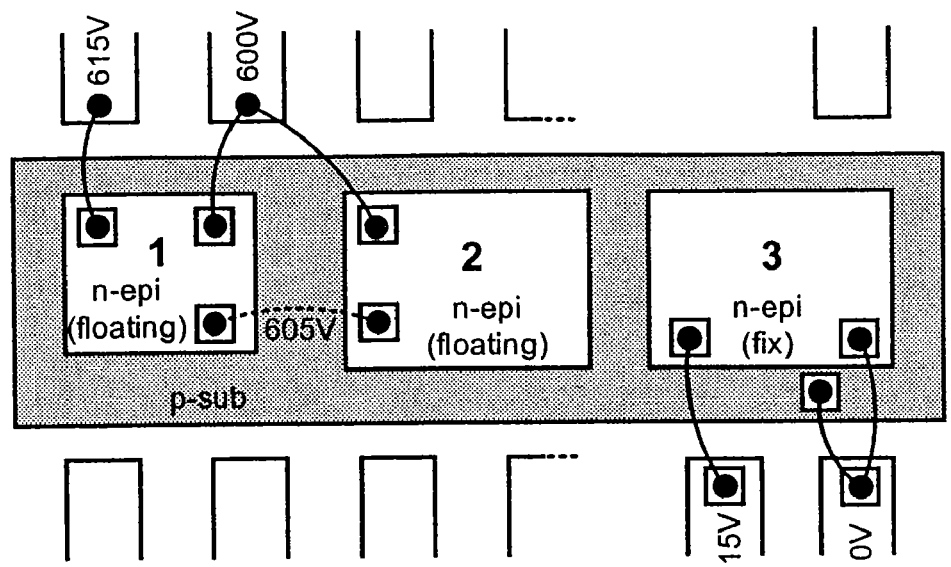
FIG. 4 is a top view diagram of a single p-type substrate having internal bonding between the floating pockets.

FIG. 4 illustrates providing $V_{out}$ to the second epi pocket by using two dedicated pads placed in the two pockets and bonded together internally. N-epi area 1 is the LVFS, n-epi area 2 includes the current sensing circuit; and n-epi area 3 is the interface section. The bond is surrounded by a plastic mold and guarantees dielectric insulation. However, because two additional pads and internal bonding are required this alternative increases the cost of the produced integrated circuit.

The preferred embodiment of the present invention involves realizing the LVFS in the same floating epi pocket in which the current sensing circuit is placed. This allows the n-epi pocket to be biased directly by the output voltage of the LVFS circuit and not by $V_F$, which is the maximum voltage value in the pocket. This embodiment is most cost effective and will be described in detail below.

Since the epi pocket is biased by the output voltage of the LVFS itself, it is important to understand the limits in the topology of this voltage supply circuit. The circuit designed to be used with the n-epi pocket is biased by an external supply $V_F$, which is also the highest voltage value it contains. Instead, it is necessary for the present invention to handle a voltage value $V_F$=15V, that is higher than the epi pocket biasing voltage $V_{out}$=5V, and ensure that all junctions were reverse-biased under all working conditions.

Figure 5:
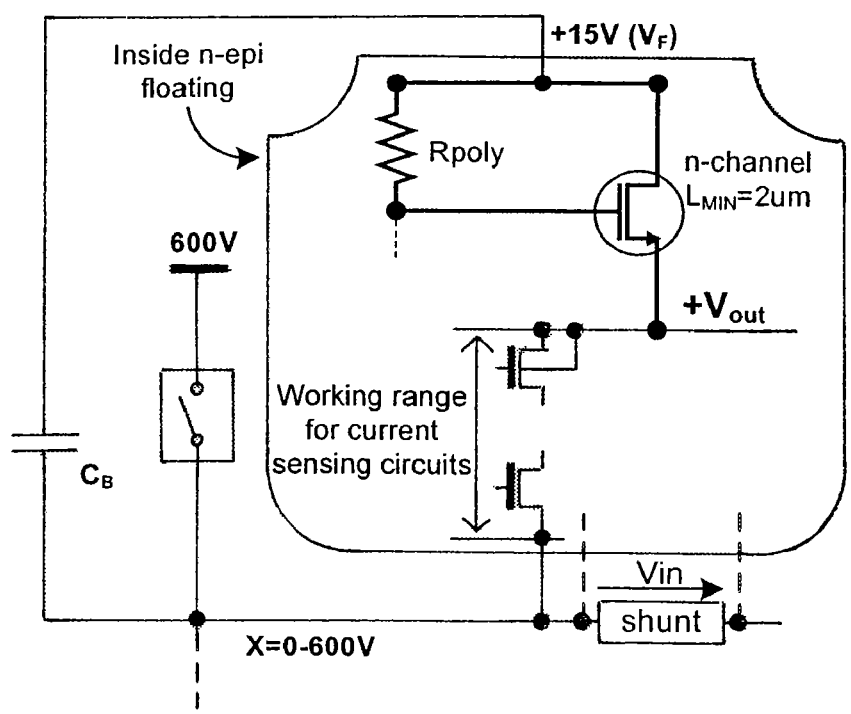
FIG. 5 is a circuit diagram of a base-structure of a regulator circuit for handling a voltage value $V_F$ that is higher than the epi-pocket biasing voltage $V_{out}$ and ensuring that all junctions were reverse-biased.
Figure 6:
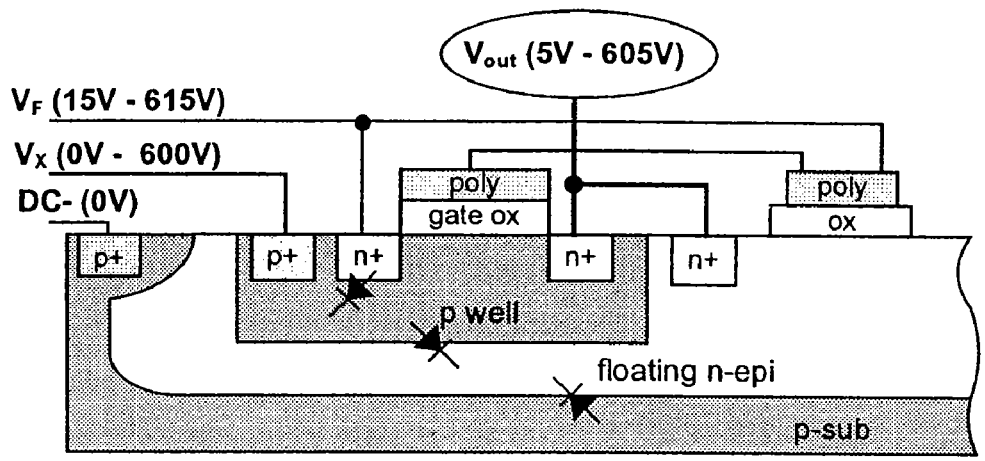
FIG. 6 is a diagram of a cross-section of a single p-type substrate in which all junctions are reverse-biased for both values of $V_X$.

As shown in FIG. 5, this result is obtained by connecting to $V_F$ only the drain terminal of n-channel MOSFETs in the 20V technology and polysilicon resistors that are isolated by their construction characteristics. FIG. 6 further illustrates a cross-section of the silicon substrate in which the realized supply structure junction is reverse-biased for both common mode values of $V_X$.

The use of an n-channel device in the 20V technology is mandatory because this MOSFET will provide the voltage $V_{out}$ through its source terminal. This means that under usual working conditions its drain to source voltage will be higher than 5V. In this way, $V_{out}$=5V biases a floating pocket and feeds current sensing circuits by moving their working range where the data provided by the shunt resistor is available ($V_{out} \div V_X$).

Figure 7:
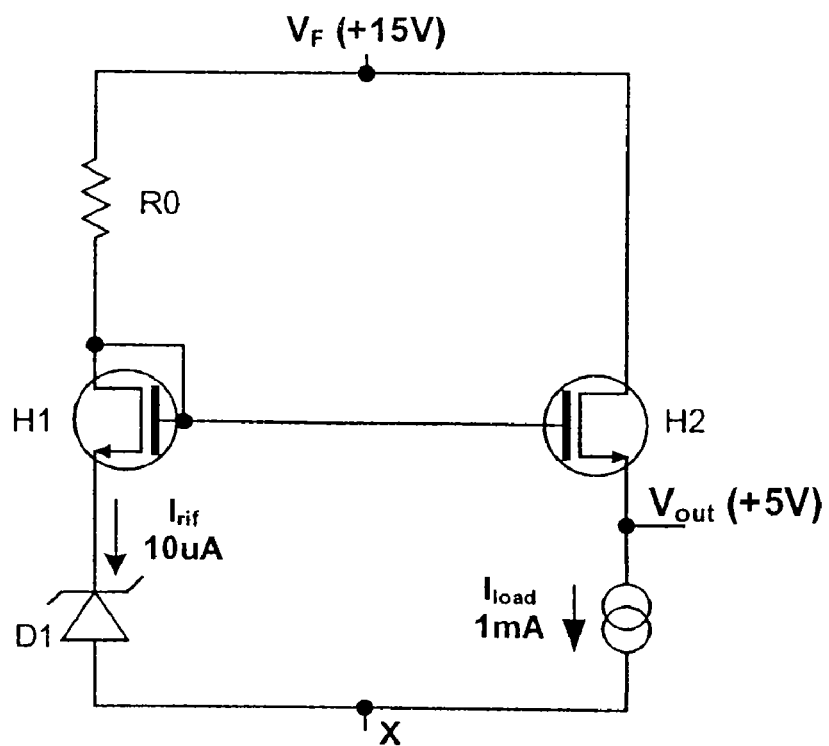
FIG. 7 is a circuit diagram of an integrated circuit including a test LVFS formed as shown in FIG. 6.

FIG. 7 illustrates a schematic of a cell of the first solution of LVFS implemented. As shown, only the drain terminal of a n-channel MOS switch H2 in the 20V technology and a polysilicon resistor R0 are connected to $V_F$, as required due to the above outlined considerations. This circuit was tested in a chip in an open loop topology allowing a $V_{out}$ to be realized based on Equation 1:

$$V_{out} = V_Z + V_{GS1} - V_{GS2} \quad (1)$$

where $V_Z$ is the reverse bias voltage of the Zener diode D1. The load current $I_{load}$=1 mA, is the maximum consumption forecast for the current sensing circuits.

Figure 8:
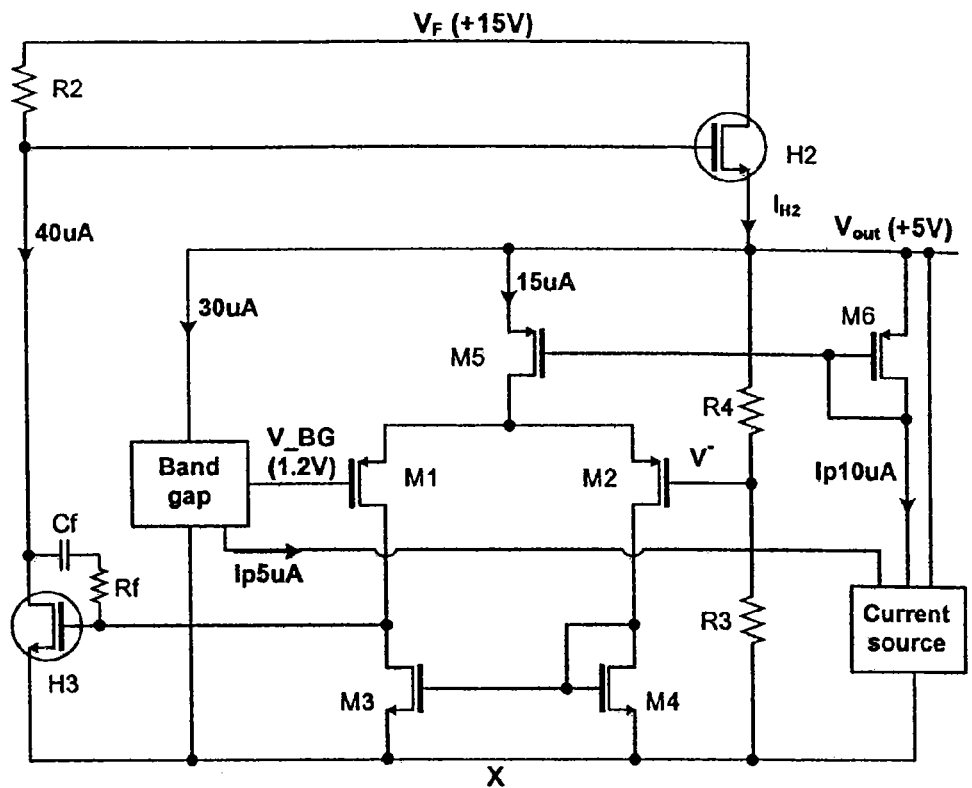
FIG. 8 is a circuit diagram of an improved integrated circuit including LVFS formed as shown in FIG. 6.
Figure 9:
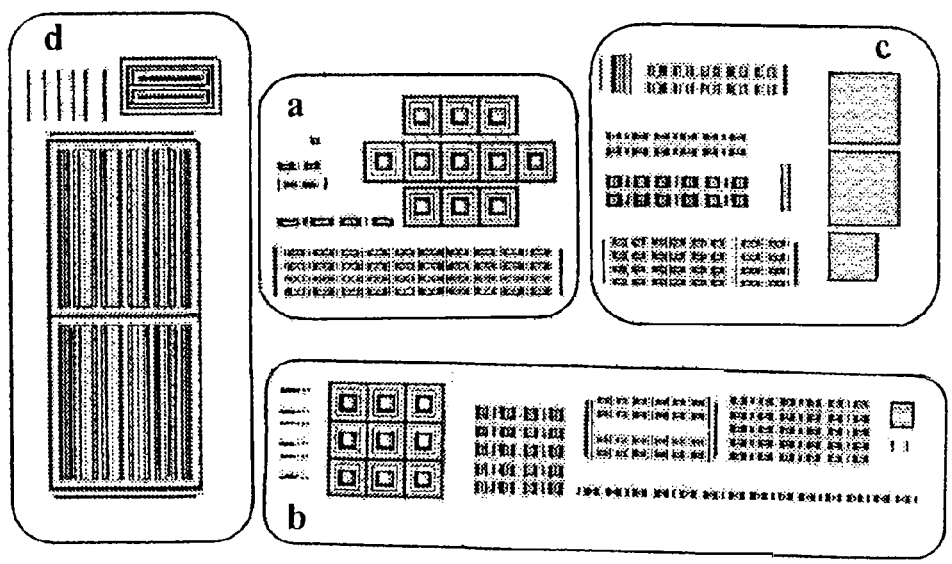
FIG. 9 is a layout diagram of the integrated circuit of FIG. 8, having an area=640×380 μm$^2$, and including a current source a bandgap voltage reference, a regulation loop, and an ESD on $V_F$.

Experimental results for the circuit having the cell of FIG. 7 lay between the limit curves obtained by a Cadence® environment, showing $V_{out}$=5.243 with a maximum deviation of 6.2%. However, this circuit did not provide a $V_{out}$ with the required precision. Therefore, a second version of the supply using a closed loop topology to improve performance was realized. The schematic and layout cells of this supply are illustrated in FIGS. 8 and 9 respectively. This closed loop topology circuit was also included in a test chip, having the same base structure as the first supply circuit with an added polysilicon resistor R2 and a n-channel MOSFET switch H2 in the 20V technology connected to $V_F$.

The regulation loop was implemented using a two-stage amplifier. It was realized in the 5V technology and supplied directly by the same output voltage realized by the circuit. The non-inverting input of the operational amplifier is the gate of a MOS switch M1 and was biased by a bandgap reference. The bandgap's output V_BG=1.2V showed a precision of ±2.8% over a temperature range −40° C.≦Temp≦140° C. The bandgap circuit included an op-amp consisting of a two-stage scheme. A bandgap reference was included because the technology used did not provide a Zener diode that could be biased by 5V. The bandgap circuit guarantees better temperature compensation and precision than the Zener diode solution. In the correct working point the inverting input of the amplifier (V⁻) was also forced to 1.2V. In this manner it was possible, after choosing the values of R3 and R4 to obtain the quiescent bias current $I_{H2}$ of the output stage and the desired value of $V_{out}$. Indeed the bias current for H2, which constitutes the buffer output stage, can be written as:

$$I_{H2} = V^-/R3 = 1.2V/R3 \quad (2)$$

While, the value of $V_{out}$ can be written as:

$$V_{out} = V^- *(1+R4/R3) \quad (3)$$

The second gain stage of the regulator amplifier was implemented as a common-source stage. It was realized in the 20V technology with a MOSFET switch H3, because under normal working conditions its drain to source voltage is higher than 5V. The differential input stage was biased by $I_1$=15 μA. In addition, a current source circuit was designed and inserted in the test chip. This circuit provided the bias current for the bandgap Ip5 uA and the regulation amplifier Ip10 uA. Both the bandgap and the current source were supplied by $V_{out}$ and realized in 5V technology. Therefore, some restrictions were placed on their topology. In fact, the collector of the NPN devices included in these circuits was the epi pocket layer and for this reason it was at 5V.

Simulations and Measurements

A comparison between the simulations of the Cadence® environment and experimental results of the circuit of FIG. 8 is reported in Table 1. In Table 1, a simulation column reports worst case limits and a test column reports the average behavior of observed chip. A worst case simulations were carried out to obtain the limit curves considered during the test. Measurements were performed on 30 samples. On an initial analysis it is important to observe how LVFS can be affected by variations in the value of $V_F$ due to the charge and discharge phases on $C_B$. The simulations showed a ±3.6% deviation from the nominal $V_{out}$. Measurements showed a lower than 2% maximum deviation from $V_{out}$.

The second analysis describes the characteristics of LVFS over a temperature range typical for such applications. The worst case simulation showed a deviation lower than 4.8% on $V_{out}$. During the test phase the working temperature of the chip was changed using a thermostream and the maximum deviation from 5V was lower than 4%.

The last analysis shows how LVFS can be affected by variations in the current load. Indeed, this supply was designed to provide a current $I_{load}$=1 mA. The simulation showed a maximum deviation lower than 4% on $V_{out}$. During test phase the maximum deviation was lower than 3.6%. It is therefore possible to conclude for these analyses that there is good agreement between the simulation and experimental results, with the experimental curves situated between the worst case curves of the simulation.

As mentioned above, $V_F$ is a noisy external supply. Therefore, it is important to analyze how $V_{out}$ is affected by a noise signal on $V_F$. For these measurements a sinusoidal signal with 2V peak to peak amplitude at several different frequencies was superimposed over $V_F$. Subsequently, the amplitude of the noise on $V_{out}$ was observed. The experimental results were worse than for the simulation. It is important to note that in the definitive version of the circuit, the output of the supply circuit will be an internal node, while in the test chip it was connected to an external pad. Therefore, there were some pFs between $V_F$ and $V_{out}$ pads. Nevertheless, a significant reduction in the external noise was still obtained.

TABLE 1

| Conditions | Simulation min ÷ max (V) | Test min ÷ max (V) |
| --- | --- | --- |
| $V_{out}$ @ T = 27° C., $V_F$ = 15 V, $I_{load}$ = 1 mA | 5.001 | 4.977-5.019 |
| $V_{out}$ changing 10 V $V_F$, 20 V | 4.889-5.175 | 4.968-5.089 |
| $V_{out}$ changing −40° C. T 140° C. | 4.766-5.226 | 4.873-5.192 |
| $V_{out}$ changing 0.5 Ma $I_{load}$1.5 mA | 4.902-5.193 | 4.889-5.172 |
| Supply noise attenuation @ 100 KHz | −80 dB | −37 dB |
| Supply noise attenuation @ 1 MHz | −40 dB | −26 dB |
| Supply noise attenuation @ 10 MHz | −23 dB | −16 dB |
| Power dissipation | 2.4 mW | 2.5 mW |

The behavior of LVFS during the swing of the $V_X$ node between 0V and 600V is reported. This swing was characterized by a slope (dV/dt) that could be some tens of Volt per nanosecond. The available measurement set up allowed us to observe the behavior of LVFS forcing $V_X$ to swing between 0V and 30V. However, this was the really critical range for the swing, considering that the capacitance of a p-sub/n-epi junction decreased with the applied reverse voltage. Consequently, the main amount of charge injection occurred in this part of the swing. With the instrumentation used it was also possible to change the slope in the swing zone with a maximum value of 1V/ns. The experimental results showed some problems arose for the LVFS during the transition from 30V to 0V of the X node (see FIG. 9). In fact, one can observe that the value of $V_{out}$ was greatly disturbed during this swing. The amplitude and the duration of this phenomenon were connected both to the swing slope and the current sunk by the load. A new simulation brought to the surface the reasons behind the problem. In fact, with $V_{out}$=5V and $V_X$=30V the p-sub/n-epi junction had a reverse bias voltage of 35V. While $V_X$ dropped to 0V some positive charge was injected in the n-epi from the junction. The problem was due to the fact that the bias for the n-epi pocket was provided by a source-follower stage MOSFET H2 (FIG. 8): this type of output stage is able to source current, but not to sink it. Therefore, this charge injection increased the value of $V_{out}$. The peak amplitude on $V_{out}$ could be reduced by increasing the current sunk by the load.

Figure 10:
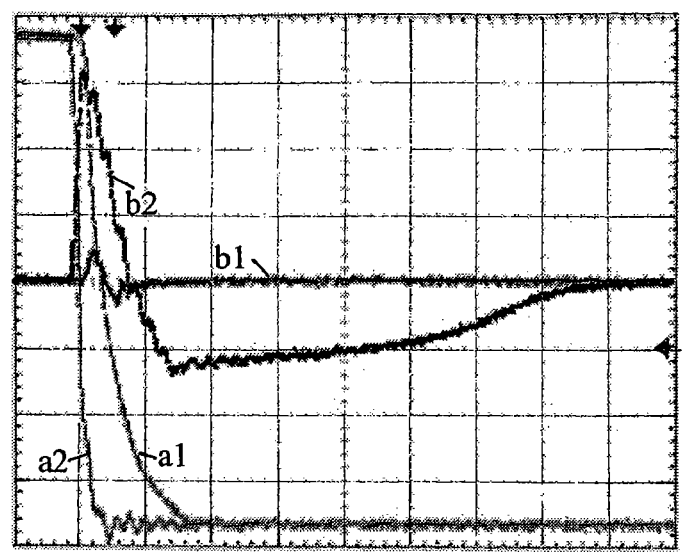
FIG. 10 is a graph showing experimental voltage waveform for negative swing, where a1) X (4V/div), b1) $\Delta V_{out}$(2V/div) @ dV/dt=0.03V/ns; a2) X (4V/div), b2) $\Delta V_{out}$ (2V/div) @ dV/dt=0.01V/ns; and a time scale 500 ns/div.
Figure 11:
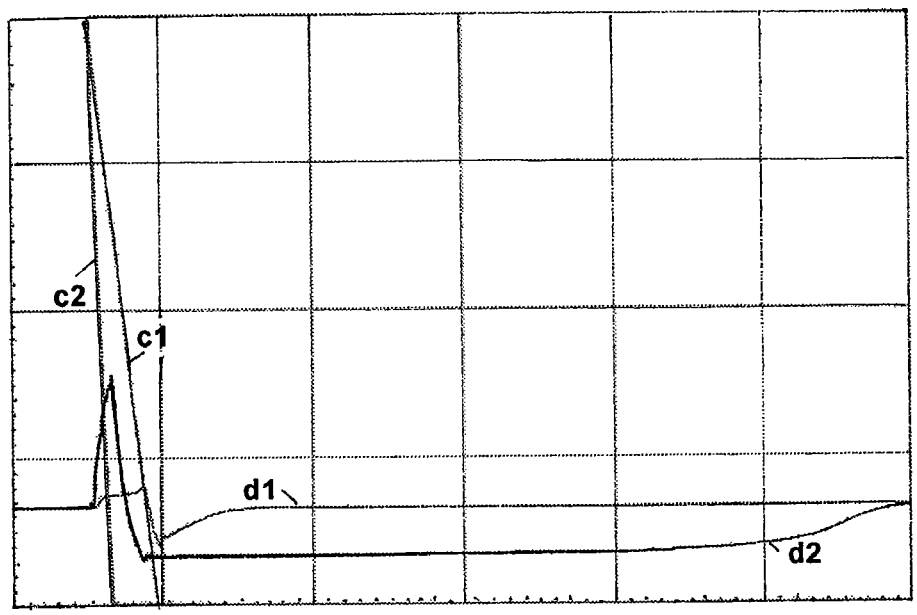
FIG. 11 is a graph showing voltage waveform for negative swing, where c1) X (7.5V/div), d1) $V_{out}$ (7.5V/div) @ dV/dt=0.03V/ns, c2) X (7.5V/div), d2) $V_{out}$ (7.5V/div) @ dV/dt=0.01V/ns, and a time scale 1 μs/div.

FIGS. 10 and 11 illustrate that $V_{out}$ remained lower than 5V after the end of the discharge phase. The duration of the phenomenon increased when the slope of $V_X'$ swing increased. This behavior was due to a slew-rate problem on the regulator op-amp. In fact, if $V_{out}$ increases, the regulator loop tries to turn it at its right working point. But for a value of $V_{out}$ higher than $V_F$, loop control is lost. As the regulator was not optimized for slewing, it needed some μs to bring the loop back to its right working point. This problem can probably be solved by implementing for LVFS an output stage, which can both source and sink current, such as a push-pull topology. In this way the charge injected in the n-epi during the negative front can be sunk.

Although the present invention has been described in relation to particular embodiments thereof, many other variations and modifications and other uses will become apparent to those skilled in the art. It is preferred, therefore, that the present invention not be limited by the specific disclosure herein.

What is claimed is:

1. An integrated circuit for powering a data acquisition circuit, the integrated circuit including an inverter application having a half-bridge driver for driving high and low side switches connected in a half bridge, the integrated circuit comprising:
   a data acquisition circuit formed in monolithic high voltage technology; and
   a Low Voltage Floating Supply (LVFS) circuit for providing voltage to the data acquisition circuit, the LVFS circuit being formed in a floating n-epi pocket biased with a voltage that is lower than a maximum value of a voltage present in the n-epi pocket.

2. The integrated circuit of claim 1, wherein the voltage provided by the LVFS circuit to the data acquisition circuit is preferably between 5 V and 3.3 V.

3. The integrated circuit of claim 1, wherein the LVFS is formed in a floating n-epi pocket of a silicon substrate of the data acquisition circuit, the n-epi pocket being biased directly by the output voltage of the LVFS.

4. The integrated circuit of claim 3, wherein the LVFS circuit is designed to be used with the n-epi pocket and is biased by an external supply which is a highest voltage value in the integrated circuit, the LVFS circuit providing the n-epi pocket biasing voltage $V_{out}$.

5. The integrated circuit of claim 4, wherein the LVFS circuit comprises a first n-channel MOSFET and a first polysilicon resistor connected between gate and drain terminals of the first n-channel MOSFET, the source of the first n-channel MOSFET providing the voltage $V_{out}$.

6. The integrated circuit of claim 5, wherein only the drain terminal of the first n-channel MOSFET and the first polysilicon resistor are connected to the external voltage source, the first n-channel MOSFET and the first polysilicon resistor being isolated by their construction characteristics.

7. The integrated circuit of claim 6, wherein the first n-channel MOSFET is in 20V technology.

8. The integrated circuit of claim 7, wherein a junction of the LVFS is reverse-biased for both common mode values of a voltage $V_X$ at the node between the high and low side switches.

9. The integrated circuit of claim 5, wherein the LVFS circuit further comprises a second n-channel MOSFET having gate and drain terminals connected to the gate of the first n-channel MOSFET and to the first polysilicon resistor, and a source terminal connected to a cathode terminal of a Zener diode, the anode terminal of the Zener diode being connected to the node between the high and low side switches.

10. The integrated circuit of claim 9, wherein the voltage $V_{out}$ is equal to the reverse bias voltage of the Zener diode plus a gate to source voltage of the second n-channel MOSFET minus a gate to source voltage of the first n-channel MOSFET.

11. The integrated circuit of claim 5, wherein the LVFS circuit further comprises: a second n-channel MOSFET having gate and drain terminals connected to the gate of the first n-channel MOSFET and to the first polysilicon resistor through a second resistor and a capacitor, and a regulation loop having a two-stage amplifier comprising: a differential stage including bandgap circuit and current source circuits, the bandgap circuit providing a bandgap reference for biasing the differential stage and the current source circuit biasing the bandgap circuit; and a gain stage implemented as a common-source stage.

12. The integrated circuit of claim 11, wherein the differential stage is realized in a 5V technology and the gain stage and the second n-channel MOSFET is realized in the 20V technology, the regulation loop being supplied directly by the output voltage $V_{OUT}$.

13. An integrated circuit for driving a load, the integrated circuit including an inverter application having a half-bridge driver for driving high and low side switches connected in a half bridge, the integrated circuit comprising:
   a current sensor formed in monolithic high voltage technology; and
   a Low Voltage Floating Supply (LVFS) circuit for providing voltage to the current sensor, the LVFS circuit being coupled between an external supply $V_F$ and the current sensor.

14. The integrated circuit of claim 13, further comprising a node voltage supply coupled between a load and a node connecting the high and low side switches, the current sensor sensing voltage across the node voltage supply.

15. The integrated circuit of claim 13, wherein the LVFS circuit is provided on an external chip connected to the node between the high and low side switches, the LVFS circuit not being integrated in the current sensor.

16. The integrated circuit of claim 13, wherein the current sensor comprises first and second floating n-epi pockets, the second n-epi pocket comprising the LVFS, a field oxide zone between the first and second epi pockets being crossed with a metal.

17. The integrated circuit of claim 16, further comprising at least two dedicated pads placed in the first and second pockets and bonded together internally for providing an output voltage $V_{OUT}$.

18. The integrated circuit of claim 17, wherein the current sensor further comprises three n-epi areas, the first area being the LVFS circuit, the second area including the current sensing circuit, and the third area being an interface section.

19. The integrated circuit of claim 18, wherein the current sensor further comprises a plastic mold for surrounding the bond and providing dielectric insulation.

* * * * *